(12) United States Patent
Mott

(10) Patent No.: US 7,430,481 B2
(45) Date of Patent: Sep. 30, 2008

(54) METHODS FOR DETECTING AND ANALYZING PILED-UP X-RAYS IN AN X-RAY SPECTROMETRY SYSTEM

(75) Inventor: Richard B. Mott, Ringoes, NJ (US)

(73) Assignee: R. J. Lee Group, Inc., Monroeville, PA (US)

(*) Notice: Subject to any disclaimer, the term of this patent is extended or adjusted under 35 U.S.C. 154(b) by 0 days.

(21) Appl. No.: 11/622,717

(22) Filed: Jan. 12, 2007

(65) Prior Publication Data
US 2008/0172206 A1    Jul. 17, 2008

(51) Int. Cl.
G06F 19/00 (2006.01)
H04B 15/00 (2006.01)

(52) U.S. Cl. .......................... 702/40; 702/190

(58) Field of Classification Search .................. 702/40, 702/81, 189, 190; 378/62, 91
See application file for complete search history.

(56) References Cited

U.S. PATENT DOCUMENTS

| | | | |
|---|---|---|---|
| 4,835,703 A | 5/1989 | Arnold et al. | |
| 5,210,423 A | 5/1993 | Arseneau | |
| 5,225,682 A | 7/1993 | Britton, Jr. et al. | |
| 5,393,982 A | 2/1995 | Mott et al. | |
| 5,459,314 A | 10/1995 | Plasek | |
| 5,873,054 A * | 2/1999 | Warburton et al. | 702/190 |
| 6,327,549 B1 * | 12/2001 | Bingham et al. | 702/180 |
| 6,525,323 B1 | 2/2003 | Vesel et al. | |
| 6,576,907 B1 | 6/2003 | Klein et al. | |
| 6,587,814 B1 * | 7/2003 | Warburton et al. | 702/190 |
| 6,590,957 B1 * | 7/2003 | Warburton et al. | 378/91 |

* cited by examiner

*Primary Examiner*—Bryan Bui
(74) *Attorney, Agent, or Firm*—Philip E. Levy; Eckert Seamans Cherin & Mellott, LLC

(57) ABSTRACT

A method of processing signals relating to a plurality of X-rays received in an X-ray spectrometry system that includes a pulse processor having a main channel and zero or more fast channels includes steps of receiving a main channel dead time signal and zero or more fast channel dead time signals generated by the pulse processor, detecting an occurrence of a plurality of piled-up X-rays in an X-ray pile-up sequence using one or more of the main channel dead time signal and the zero or more fast channel dead time signals, counting the X-rays in said pile-up sequence, and if one or more fast channels are present, classifying an energy band of each of the piled-up X-rays using one or more of the main channel dead time signal and the one or more fast channel dead time signals.

39 Claims, 10 Drawing Sheets

Main Channel

Fast Channel- 1

Fast Channel- 2

METHODS FOR DETECTING AND ANALYZING PILED-UP X-RAYS IN AN X-RAY SPECTROMETRY SYSTEM

FIELD OF THE INVENTION

The present invention relates to X-ray spectrometry systems, and in particular to methods for detecting and analyzing and obtaining certain information relating to piled-up X-rays in an X-ray spectrometry system and/or using that information to perform additional X-ray related analyses.

BACKGROUND OF THE INVENTION

X-ray spectrometry systems are used for detecting, measuring and analyzing X-ray emissions from, for example, a scanning electron microscope (SEM). As is known, X-ray emission spectra measured by an X-ray spectrometry system are frequently used in analyzing the elemental composition of materials and are generated by measuring the energies of a great number of emitted X-rays and plotting the numbers of emitted X-rays against the measured energy in a histogram. Emission lines characteristic of chemical elements or isotopes appear as peaks in the resulting histogram, and the pattern and heights of these peaks can be used to determine the composition.

A typical X-ray spectrometry system includes the following four main components: (1) a detector, (2) a pre-amplifier, (3) a pulse processor, and (4) a computer-based analyzer. The detector, which usually takes the form of a semiconductor sensor of some type, converts an incoming X-ray into a very small current pulse, typically on the order of tens to thousands of electrons, with a duration of about tens to a few hundreds of nanoseconds. The pre-amplifier amplifies the current pulse output by the detector and typically converts it into a voltage signal in the range of tenths of millivolts up to a few hundreds of millivolts. The pulse processor receives the pre-amplifier signal and generates a numeric representation of the X-ray photon energy through an integration process. The computer-based analyzer accumulates the X-ray photon energies output by the pulse processor into a spectrum or plot of the number of X-rays detected against their energies.

The portion of the pulse processor that derives the X-ray energy from the pre-amp signal is commonly referred to as the main channel. As noted above, the main channel derives X-ray energy using a signal integration process, called pulse shaping, which can take any of several mathematical forms approximated either by analog circuitry or by digital signal processing. The pulse processor has a user-selectable time, variously called the time constant, the shaping time or the rise time (for convenience, the term "shaping time" will be used herein), which determines the amount of signal integration that is performed in the main channel. In addition, a pulse processor parameter called dead time, referred to as $D_M$ herein, is proportional to the shaping time, with the proportionality constant being determined by the particular pulse shaping function that is used. If a second X-ray arrives (i.e., a pulse corresponding thereto is output by the pre-amplifier) within a time period equal to the dead time $D_M$ after arrival of a first X-ray, then both the first and second X-ray are discarded by the pulse processor because the response of the main channel pulse shaper will be distorted and its maximum will no longer be an accurate measure of the energy of either X-ray. This phenomenon is known as pulse pile-up. Thus, the main channel dead time $D_M$ is the amount of time that it takes for the main channel of the pulse processor to accurately and unambiguously measure the energy of a single X-ray. If a second X-ray arrives before the dead time interval expires, pile-up has occurred and no measurement of X-ray energy is made.

In addition, pulse processors output a signal, referred to herein as the main channel dead time signal, which is in an active state whenever an X-ray pulse is being processed in the main channel. We will describe an active-high system, in which the active state is indicated by a high logic voltage, but those of ordinary skill in the art will recognize that active-low logic is equally feasible. FIG. 1 illustrates an output 5 of the pre-amplifier of a current X-ray spectrometry system employing digital triangle shaping when a single X-ray is received at time $T_1$, with no subsequent pile-up (i.e., with no arrival of a second X-ray within the main channel dead time $D_M$). As seen in FIG. 1, in such a case, the main channel dead time signal 10 will go high at time $T_1$, and will remain high for a time period equal to the dead time $D_M$, after which it goes low again. FIG. 1 also shows the output 15 of the pulse processor which represents the energy of the X-ray. FIG. 2 demonstrates what happens when pile-up occurs. In particular, FIG. 2 shows the output 5 of the pre-amplifier when a first X-ray is received at time $T_1$, and a second X-ray is received at time $T_2$ wherein $(T_2-T_1)<D_M$ (i.e., pile-up). As seen in FIG. 2, in such a case, the main channel dead time signal 10 will go high at time $T_1$ (when the first X-ray arrives) and will remain high for a time period equal to the dead time $D_M$ following the arrival of the second X-ray at time $T_2$, after which it goes low again at time $T_3$ (this is true provided the pulse processor's dead time following any X-ray's arrival is constant; such pulse processors are referred to as "paralyzable" in the art, an example of which is the Saturn model pulse processor from X-ray Instrumentation Associates in Hayward, Calif.). In other words, the high state of the main channel dead time signal 10 during pile-up will be extended by $D_M$ after the arrival of each X-ray in the sequence. Because this is a pile-up situation, each of the X-rays will be discarded and the pulse processor will not output an energy value.

In order to detect pulse pile-up, pulse processors may also be provided with one or more additional processing paths (i.e., in addition to the main channel) known as fast channels or pulse pile-up channels. The fast channels have very short shaping times, and thus very short dead times $D_F$, as compared to the main channel. Like the main channel, each fast channel has associated therewith a fast channel dead time signal which is in a high state whenever the fast channel is processing an X-ray. Because the fast channel dead times $D_F$ are much shorter than the main channel dead time $D_M$, the fast channels are much more likely to produce distinct fast channel dead time signal pulses for each of a number of X-rays arriving close together in time.

Moreover, the shaping time (and thus dead time) of any pulse processing channel (main or fast) determines the lowest energy X-ray which can be detected in that channel, known as the detection threshold for the channel. In particular, detection threshold is inversely proportional to shaping time while the minimum detectable time separation, which defines pile-up recognition performance, is directly proportional to shaping time. FIG. 3 shows the progression of noise levels and detection thresholds from the main channel to the longest fast channel through the shortest fast channel. X-rays lower in energy than the main channel threshold $T_{main}$ are undetectable. If more than one fast channel is provided, each fast channel uniquely detects an energy band, shown in Portion 3a of FIG. 3 as Band 1, Band 2 and Band 3, which is the difference between its detection threshold and that of the fast channel with the next shorter shaping time. Portions 3b-3e of FIG. 3 show an idealized, noise-free preamplifier output step function resulting from the arrival of an X-ray, the digital filter shape typical for a digital triangle shaper, and the output from each of the digital filters for a hypothetical system with one main channel and three fast channels. Note that the noise fluctuation range of the outputs of each of the digital filters, shown as the bottom trace of portion 3a of FIG. 3, becomes larger as the width of the shaping filters becomes shorter. The main channel digital filter shape typically has a period of constant negative weight, followed by a small gap of zero weight, followed by an equal period of constant positive weight. The gap, which gives a short flat top to the otherwise triangular the digital filter output, is wide enough to cover the finite rise time of the preamplifier step, and is required to avoid including the rapidly-changing preamplifier signal samples in the rise time in the weighted output of the digital filter, which would degrade the accuracy of the energy measurement. The fast channels, although shown in portions 3c-3e with such a gap, do not necessarily need one because they are not used for energy measurement. Current state of the art X-ray spectrometry systems will typically be able to distinguish X-rays energies as low as 100-200 eV from noise in the main channel, but the detection threshold of the shortest fast channel is much higher, typically up to 1,000-2,000 eV. Some existing pulse processors have as many as three fast channels to improve overall pile-up rejection performance in the range between 100 and 1,000 eV.

Currently, the fast channels of pulse processors are only used internally by the pulse processor to detect pile-up. In older analog pulse processors, an inhibit signal is generated when pile-up is detected which prevents the external analog-to-digital converter from digitizing the peak of the main channel output pulse. In newer digital pulse processors, an internal logic signal is generated when pile-up is detected which prevents succeeding stages of digital processing from capturing the distorted pulse. This approach, however, ignores the fact that it is possible to derive additional useful information from the main and fast channels. Thus, there is a need for processing methods that derive useful information from the main and fast channel outputs.

SUMMARY OF THE INVENTION

In a first embodiment, the invention provides a method of processing signals relating to a plurality of X-rays received in an X-ray spectrometry system that includes a pulse processor having a main channel and one or more fast channels. The method includes steps of receiving a main channel dead time signal and one or more fast channel dead time signals generated by the pulse processor. The main channel dead time signal has a first main channel active state that indicates that at least one X-ray is being processed by the main channel. Similarly, each of the one or more fast channel dead time signals has a respective first fast channel active state that indicates that at least one X-ray is being processed by a corresponding respective one of the one or more fast channels. The method further includes detecting an occurrence of a plurality of piled-up X-rays in an X-ray pile-up sequence using one or more of the main channel dead time signal and the one or more fast channel dead time signals and classifying an energy level of each of the piled-up X-rays using one or more of the main channel dead time signal and the one or more fast channel dead time signals. In the pile-up sequence, a first one of the piled-up X-rays causes the main channel dead time signal to be in the first main channel active state and each of the piled-up X-rays other than the first one of the piled-up X-rays arrives while the main channel dead time signal is in the first main channel active state. The method may further include determining an arrival time for one or more of the piled-up X-rays using one or more of the main channel dead time signal and the one or more fast channel dead time signals. Alternatively, the method may further include determining, for one or more pairs of the piled-up X-rays, a time interval between the arrival of each of the piled-up X-rays in the pair using one or more of the main channel dead time signal and the one or more fast channel dead time signals. The method may further include using at least the energy level and/or the arrival time of one or more of the piled-up X-rays, or the time interval between pairs of piled-up X-rays, to analyze one or more materials.

In one particular embodiment, the main channel has a main channel detection threshold and each of the one or more fast channels has a corresponding respective fast channel detection threshold. In this embodiment, the classifying step includes classifying an energy level of each of the piled-up X-rays by segregating each of the piled-up X-rays into either a first low energy group or a second high energy group, wherein each of the piled-up X-rays segregated into the first low energy group has an energy level above the main channel detection threshold and below the fast channel detection threshold of each of the one or more fast channels and wherein each of the piled-up X-rays segregated into the second high energy group has an energy level above the fast channel detection threshold of at least one of the one or more fast channels. The one or more fast channels may be a single fast channel, in which case each of the piled-up X-rays segregated into the second high energy group has an energy level above the fast channel detection threshold of the single fast channel. Alternatively, the one or more fast channels may be a plurality of fast channels, wherein the classifying step comprises classifying an energy level of each of the piled-up X-rays as belonging to one of a plurality of energy bands as illustrated in FIG. 3 including a first energy band between the main channel detection threshold and a lowest one of the fast channel detection thresholds, a plurality of second energy bands between respective consecutive ones of the fast channel detection thresholds, and a third energy band above a highest one of the fast channel detection thresholds.

In another embodiment, the method further includes using a result of the classifying step to aid in discriminating between at least two elemental compositions, by raising the triggering threshold of one or more fast channels above its minimum detectable energy, in order to include or exclude specific peaks in the X-ray emission spectrum within one or more of the plurality of energy bands as illustrated in FIG. 3. This step may, in particular, include generating a high-low energy distribution of the piled-up X-rays using the energy level of each of the piled-up X-rays and using the high-low energy distribution to aid in discriminating between at least two elemental compositions. Where the first low energy group and the second high energy group are created, the method may further include using the first low energy group and the second high energy group to aid in discriminating between at least two elemental compositions. Specifically, the method may include generating a high-low energy distribution of the piled-up X-rays using the first low energy group and the second high energy group and using the high-low energy distribution to aid in discriminating between at least two elemental compositions.

In still another particular embodiment, when the emission location of the X-rays is moving over time, for example during scanning of an electron beam in a scanning electron microscope, the method may include using, for one or more of the one or more of the piled-up X-rays, the arrival time thereof to infer an emission location thereof from a material. The emission location of each of the one or more of the piled-up X-rays may be used to place the piled-up X-rays at a correct pixel location in an image of the material.

In another particular embodiment of the method, $W_{max}$ represents a widest, in terms of time, pulse in the main channel dead time signal that is expected to result from a single X-ray being processed in the main channel. In this embodiment, the method further includes monitoring the main channel dead time signal and inferring the presence of an additional X-ray in the pile-up sequence for each extension of the main channel dead time signal beyond the last integer multiple of $W_{max}$. Thus any pulse width greater than $W_{max}$ to $2W_{max}$ implies at least 2 X-rays; from greater than $2W_{max}$ to $3W_{max}$ implies at least 3 X-rays; and so forth. When the pulse processor is operated at 50% dead time, approximately 25% of the main channel pulses will contain 3 or more X-rays.

In another embodiment, the invention provides a method of processing signals relating to a plurality of X-rays received in an X-ray spectrometry system that includes a pulse processor having a main channel and one or more fast channels that provides for the detection of a pile-up consisting of an arbitrary sequence of low energy and high energy X-rays wherein all high energy pile-up X-rays may be detected and accurately timed, wherein all leading and trailing low energy X-rays in the sequence may be detected and accurately timed, and wherein certain intermediate low energy X-rays may be detected, although not timed. The method in this embodiment includes receiving a main channel dead time signal and one or more fast channel dead time signals generated by the pulse processor as described above, setting a countdown timer to a value $W_{max}$, and starting the countdown timer and noting an occurrence of a first one of a plurality of piled-up X-rays in an X-ray pile-up sequence when the main channel dead time signal moves to the first main channel active state. The method further includes classifying an energy level of the first one of the plurality of piled-up X-rays using one or more of the main channel dead time signal and the one or more fast channel dead time signals, noting an occurrence of a subsequent high energy one of the plurality of piled-up X-rays and resetting the countdown timer to $W_{max}$ each time one or more of the one or more fast channel dead time signals moves to the first fast channel active state thereof while the dead time signal is still in the first main channel active state as a result of the starting step, and noting an occurrence of a subsequent low energy one of the plurality of piled-up X-rays and resetting the countdown timer to $W_{max}$ each time the countdown timer reaches zero while the dead time signal is still in the first main channel active state as a result of the starting step.

In still another embodiment, the invention provides a method of processing signals relating to a plurality of X-rays received in an X-ray spectrometry system that includes a pulse processor having a main channel (and that may or may not also have a fast channel or channels; as is apparent from the recitation provided below, this particular embodiment does not employ any fast channel dead time signals). The method includes receiving a main channel dead time signal generated by the pulse processor, wherein the main channel dead time signal is in a first main channel active state when at least one X-ray is being processed by the main channel, and setting a countdown timer to a value $W_{max}$, wherein $W_{max}$ represents a widest, in terms of time, pulse in the main channel dead time signal that is expected to result from a single X-ray being processed in the main channel. The method further includes starting the countdown timer and noting an occurrence of a first one of a plurality of piled-up X-rays in an X-ray pile-up sequence when the main channel dead time signal moves to the first main channel active state, and noting an occurrence of a subsequent one of the plurality of piled-up X-rays and resetting the countdown timer to $W_{max}$ each time the countdown timer reaches zero while the dead time signal is still in the first main channel active state as a result of the starting step.

Therefore, it should now be apparent that the invention substantially achieves all the above aspects and advantages. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

BRIEF DESCRIPTION OF THE DRAWINGS

The accompanying drawings illustrate presently preferred embodiments of the invention, and together with the general description given above and the detailed description given below, serve to explain the principles of the invention. As shown throughout the drawings, like reference numerals designate like or corresponding parts.

DESCRIPTION OF THE PREFERRED EMBODIMENTS

Figure 1:
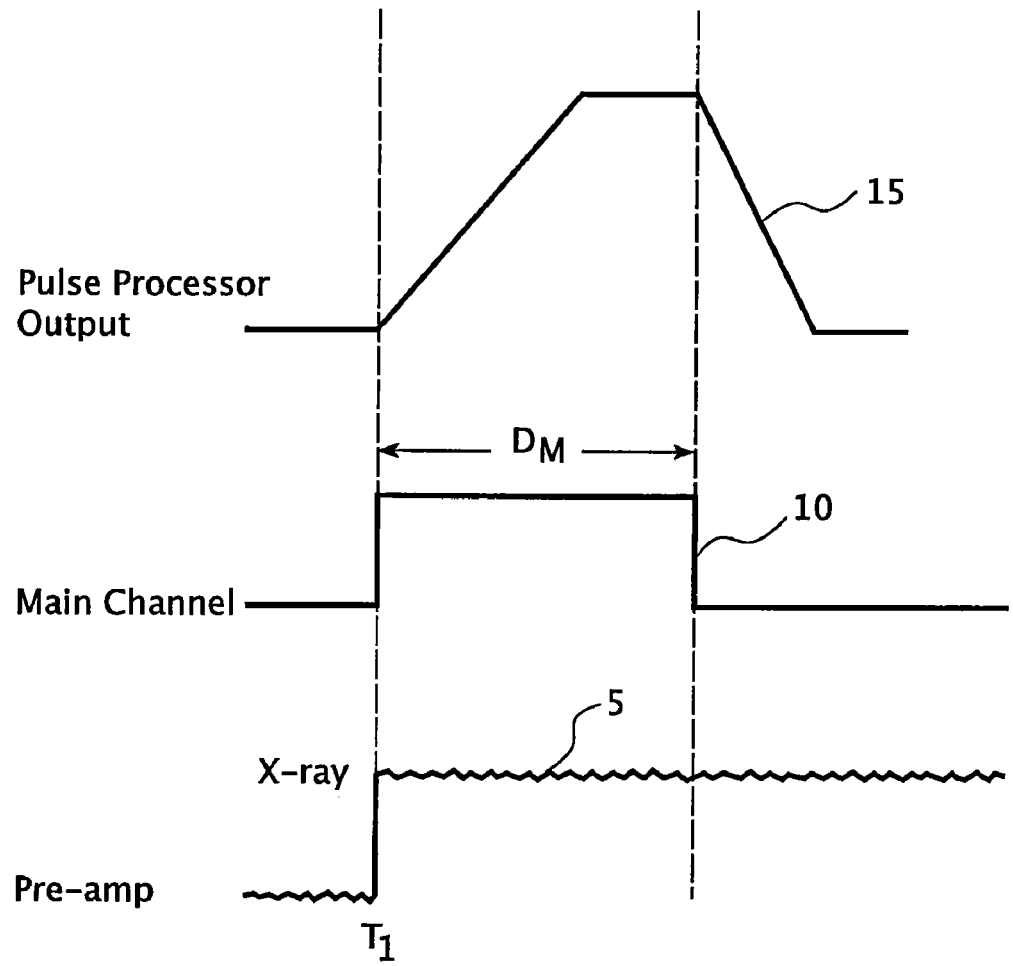
FIG. 1 is a schematic illustration of a pre-amplifier output, a main channel dead time signal and a pulse processor output of a current X-ray spectrometry system when a single X-ray is received.
Figure 2:
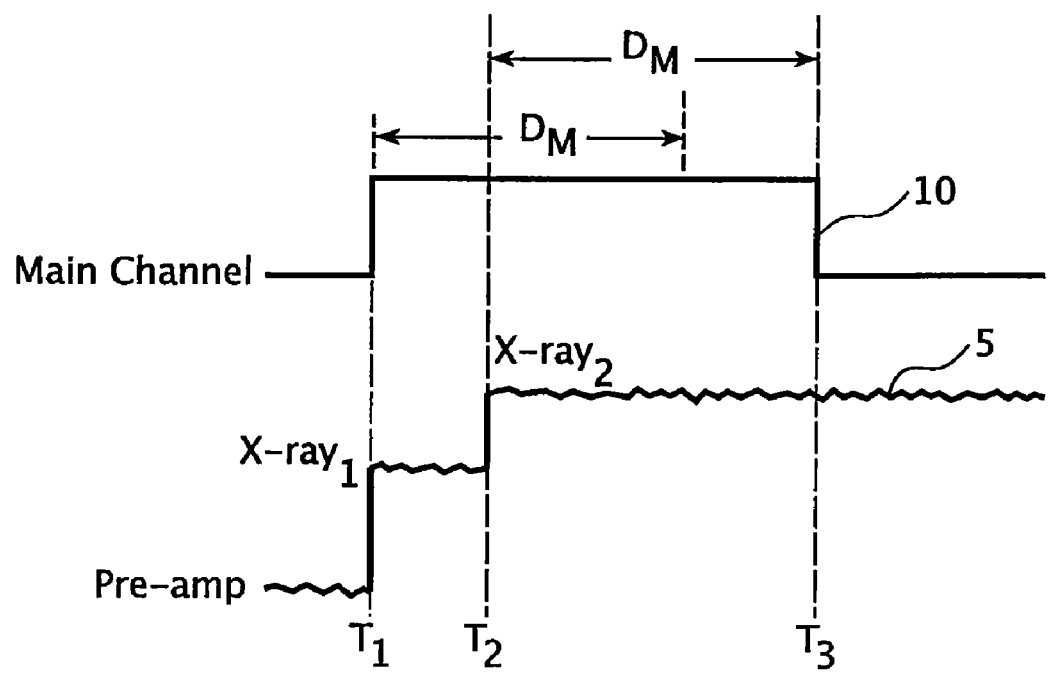
FIG. 2 is a schematic illustration of a pre-amplifier output and a main channel dead time signal of a current X-ray spectrometry system during pile-up.
Figure 3:
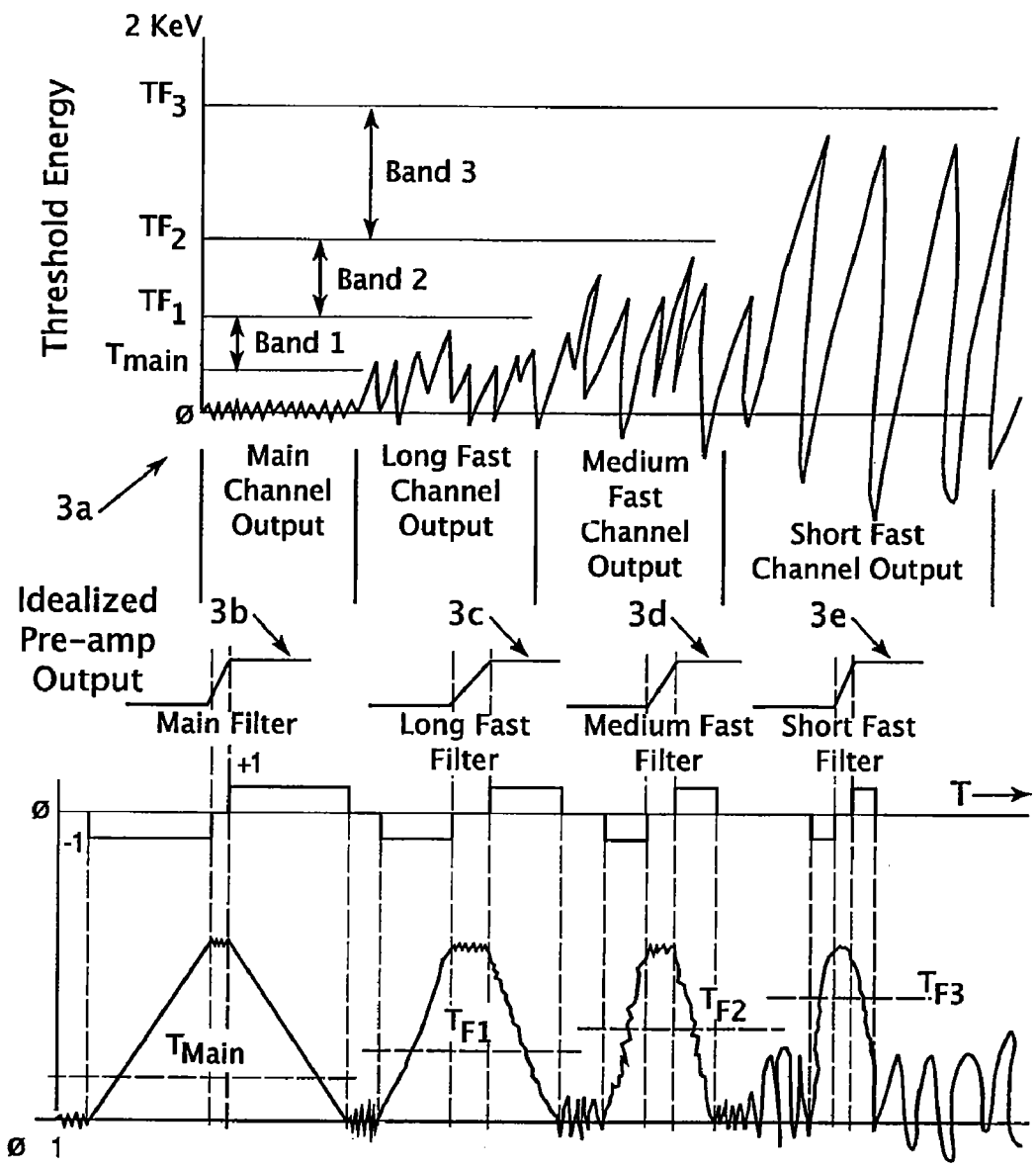
FIG. 3 is a schematic illustration of the relationship between digital filter width, which determines shaping time, and the filter's output noise level and resulting energy detection threshold.
Figure 4:
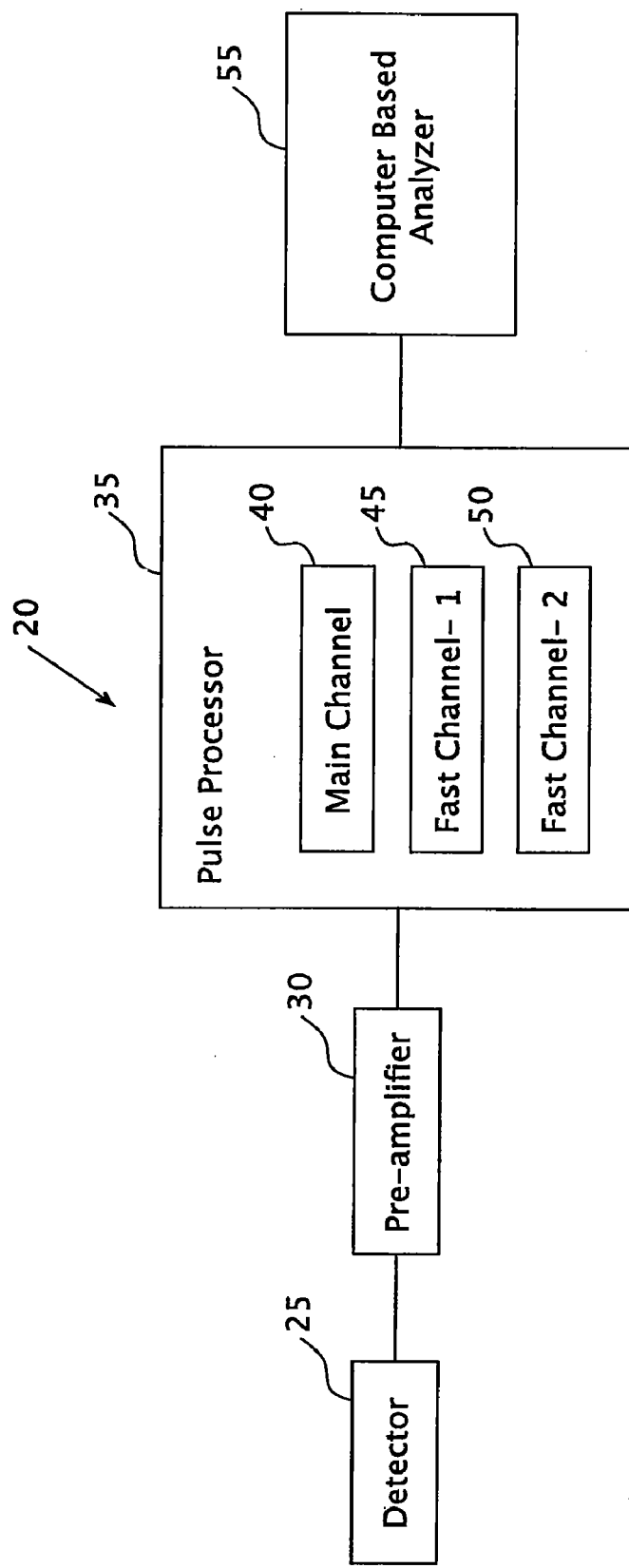
FIG. 4 is a block diagram of an X-ray spectrometry system according to one embodiment of the invention.
Figure 5A:
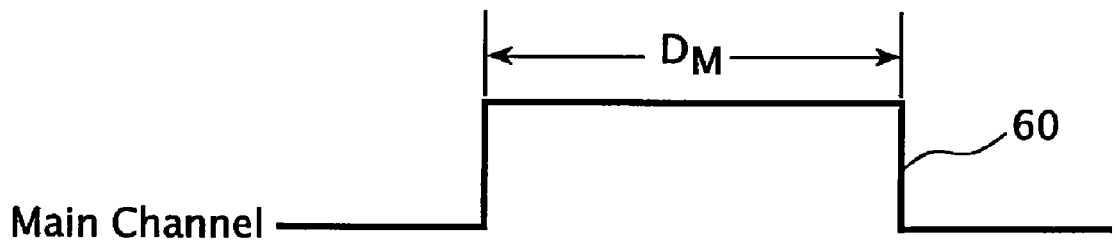
FIGS. 5A, 5B and 5C are schematic illustrations of the main channel dead time signal, the first fast channel dead time signal and the second fast channel dead time signal, respectively generated by the pulse processor of the X-ray spectrometry system shown in FIG. 4.
Figure 5B:
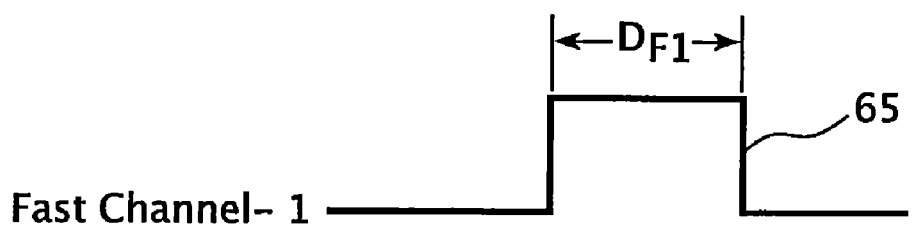
Figure 5C:
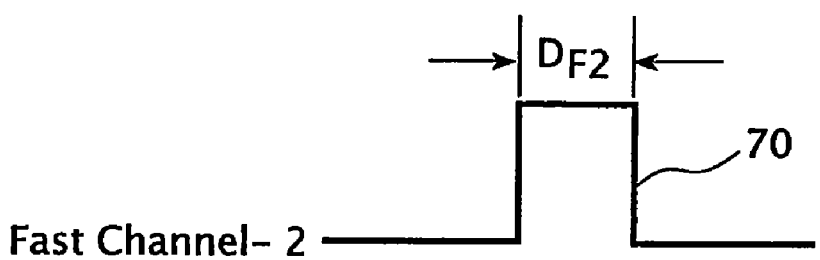

The present invention provides methods for use in an X-ray spectrometry system, such as the X-ray spectrometry system 20 shown in FIG. 4, for detecting that a pile-up condition (of two or more X-rays) has occurred, for counting and classifying the pile-up X-rays according to energy level, and for determining, in certain cases, the timing of the pile-up X-rays (i.e., when they occurred). Referring to FIG. 4, the X-ray spectrometry system 20 includes a detector 25, a pre-amplifier 30, a pulse processor 35 and a computer-based analyzer 55. The pulse processor 35 includes a main channel 40, a first fast channel 45 (having a first detection threshold) and a second fast channel 50 (having a second detection threshold that is higher than the detection threshold of the first fast channel 45). For example, the detection threshold in the main channel 40 may be 100 eV, the detection threshold in the first fast channel 45 may be 1,000 eV and the detection threshold in the second fast channel 50 may be 2,000 eV. The pulse processor 35 will output a main channel dead time signal 60 (shown in FIG. 5A) based on the processing of the main channel 40, a first fast channel dead time signal 65 (shown in FIG. 5B) based on the processing of the first fast channel 45, and a second fast channel dead time signal 70 (shown in FIG. 5C) based on the processing of the second fast cannel 50. Furthermore, the main channel 40 has a main channel dead time $D_M$, the first fast channel 45 has a fast channel dead time $D_{F1}$, and the second fast channel 50 has a fast channel dead time $D_{F2}$.

Preferably, the pulse processor 35 uses digital signal processing to perform the pulse shaping. This is preferred because digital pulse shaping filters may have what is known as finite impulse response (FIR), meaning the response is guaranteed to be zero after a certain period of time. Analog pulse-shaping circuitry often has an exponential characteristic in which the output in theory never goes to zero. Therefore, pulse width testing as described herein is easier and more accurate for FIR digital shaping. It is also preferable for the pre-amplifier 30 to be of a type commonly referred to as "pulsed reset" rather than of a type commonly referred to as "RC" or "tail pulse," because the pulses from the latter have an output which is a sharp peak followed by an exponential decline. The presence of any exponential decay component in the signal chain degrades the FIR nature of digital signal processing because the response of the preamplifier never theoretically returns to zero.

According to an aspect of the invention, the main and fast channel dead time signals of an X-ray spectrometry system are obtained and are used to count the X-rays within a pile-up sequence, classify their energies as above or below one or more fast channel thresholds, and measure the time intervals between them where possible. In the particular embodiment shown in FIG. 4, the main channel dead time signal 60, the first fast channel dead time signal 65 and the second fast channel dead time signal 70 are obtained and are used to detect the X-rays within a pile-up sequence, classify their energies as being one of: (i) above the main channel detection threshold but below the first fast channel detection threshold (referred to as a low energy X-ray L), (ii) above the first fast channel detection threshold but below the second fast channel detection threshold (referred to as a high energy X-ray H-1), or (iii) above the second fast channel threshold (referred to as a high energy X-ray H-2), and, where possible, measure the timing of each X-ray in the pile-up sequence.

As will be appreciated by those of skill in the art, the main channel dead time $D_M$ is not really a constant. Instead, there is some variability due to noise fluctuations and any residual dependence on X-ray energy, which tends to be larger at the lowest energies. Thus, according to an aspect of the present invention, a value $W_{max}$ is defined to represent the widest (in terms of time) pulse in the main channel dead time signal 60 that is expected to result from a single X-ray being processed in the main channel 40. In other words, $W_{max}$ represents $D_M$ plus the worst case variation. Thus, if a pulse observed in the main channel dead time signal 60 exceeds $W_{max}$, then it can be inferred that at least one other X-ray must have arrived during the pulse. In general, each additional multiple of $W_{max}$ in the main channel dead time pulse 60 implies the arrival of at least one additional X-ray.

In a first particular embodiment, described in detail herein, the present invention provides a method for detecting a pile-up consisting of two X-rays (in, for example, the main channel 40 of the pulse processor 35 shown in FIG. 4), accurately classifying each of the two pile-up X-rays according to energy level (based on the fast channel detection thresholds) and determining an arrival time of each of the two pile-up X-rays. In a second particular embodiment, also described in detail herein, the present invention provides a method for detecting a pile-up consisting of an arbitrary sequence of low energy (L) and high energy (H-1 and H-2) X-rays (in, for example, the main channel 40 of the pulse processor 35 shown in FIG. 4), and for classifying and timing certain of the pile-up X-rays, namely all of the high energy X-rays in the sequence, an initial and/or final low energy X-ray in the sequence, if present, and certain intermediate low energy X-rays in the sequence, if present.

The first embodiment of the method will now be described with reference to FIGS. 6-9. That method will also be described in connection with the X-ray spectrometry system 20 shown in FIG. 4 although it should be appreciated that this is meant to be exemplary only and that other X-ray spectrometry configurations (with more or less fast channels) may also be used. The method in this embodiment monitors the main channel dead time signal 60 for a pile-up indicating condition therein which indicates a pile-up consisting of two X-rays in the main channel 40. In particular, if a pulse having a width greater than $W_{max}$ but less than $2W_{max}$ is detected in the main channel dead time pulse signal 60, then that implies that a pile-up consisting of only two X-rays has occurred. Once that condition has been detected, then the main channel dead time signal 60, the first fast channel dead time signal 65 and the second fast channel dead time signal 70 may be used to classify the energy and arrival time of each pile-up X-ray in the two X-ray sequence. As will be appreciated, a two X-ray pile-up sequence may consist of four possible X-ray combinations as follows: (i) two high energy X-rays (H-1 or H-2) in sequence, (ii) a low energy X-ray (L) followed by a high energy X-ray (H-1 or H-2), (iii) a high energy X-ray (H-1 or H-2) followed by a low energy X-ray (L), or (iv) two low energy X-rays (L) in sequence. Each of these possible combinations is described in connection with FIGS. 6-9.

Figure 6:
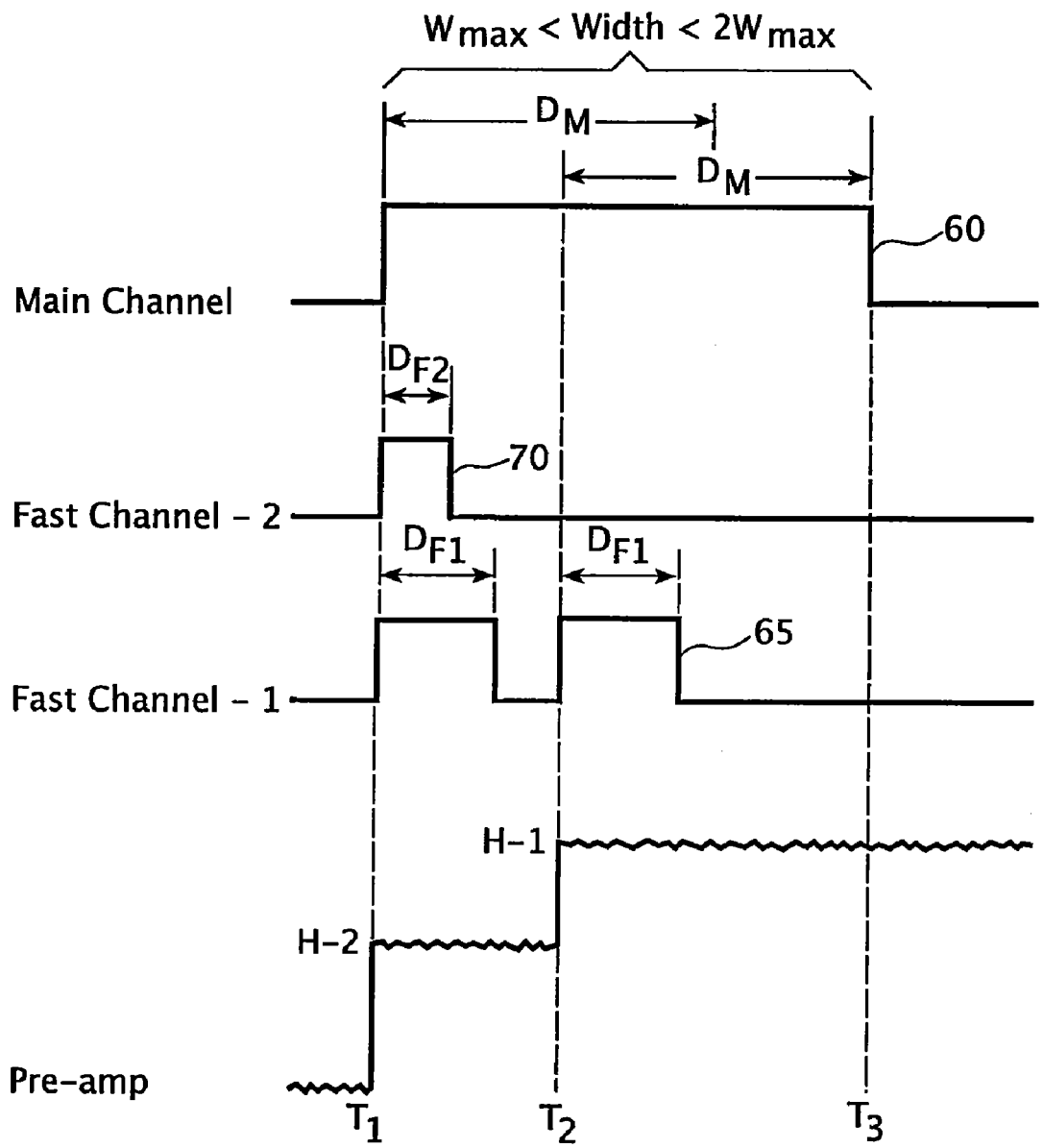
FIG. 6 is a schematic illustration of the situation where a two X-ray pile-up consists of two high energy X-rays in sequence and shows the states of the main channel dead time signal, the first fast channel dead time signal and the second fast channel dead time signal in response thereto.

FIG. 6 illustrates the situation where a two X-ray pile-up consists of two high energy X-rays in sequence. In particular, as seen in FIG. 6, a first high energy X-ray H-2 (having an energy that is above the detection threshold of the second fast channel 50) arrives at time $T_1$ and a second high energy X-ray H-1 (having an energy that is above the detection threshold of the first fast channel 45 but below the detection threshold of the second fast channel 50) arrives at time $T_2$. As noted above, the existence of the two X-ray pile-up may be inferred from the main channel dead time signal 60, and in particular from the fact that it includes a pulse having a width that is greater than $W_{max}$ but less than $2W_{max}$. As seen in FIG. 6, the first high energy X-ray H-2 will cause both the second fast channel dead time signal 70 and the first fast channel dead time signal 65 to be triggered (go high) at time $T_1$ and the second high energy X-ray H-1 will cause the first (but not the second) fast channel dead time signal 65 to be triggered (go high) at time $T_2$. In addition, the main channel dead time signal 60 will be triggered at time $T_1$ and will remain high until time $T_3$ (i.e., until the processing of the second high energy X-ray H-1 is completed). Thus, once it is determined from the main channel dead time signal 60 that a two X-ray pile-up has occurred as described above, logic can be used to discern from the main channel dead time signal 60, the first fast channel dead time signal 65 and the second fast channel dead time signal 70 the energy level of each pile-up X-ray and the time at which each pile-up X-ray arrived. In particular, referring to FIG. 6, because both the main channel 40 and the second fast channel 50 were triggered at time $T_1$, it can be discerned that the first X-ray in the pile-up was a high energy X-ray H-2 (having an energy above the detection threshold of the second fast channel 50) and that that X-ray arrived at time $T_1$ (the time of the second fast channel 50 trigger). In addition, because the first (but not the second) fast channel 45 was triggered at time $T_2$ while the main channel dead time signal 60 remained high, it can be discerned that the second X-ray in the pile-up was a high energy X-ray H-1 (having an energy between the detection thresholds of the first fast channel 45 and the second fast channel 50) and that that X-ray arrived at time $T_2$ (the time when the first fast channel 45 was triggered without the second fast channel 50 also being triggered).

Figure 7:
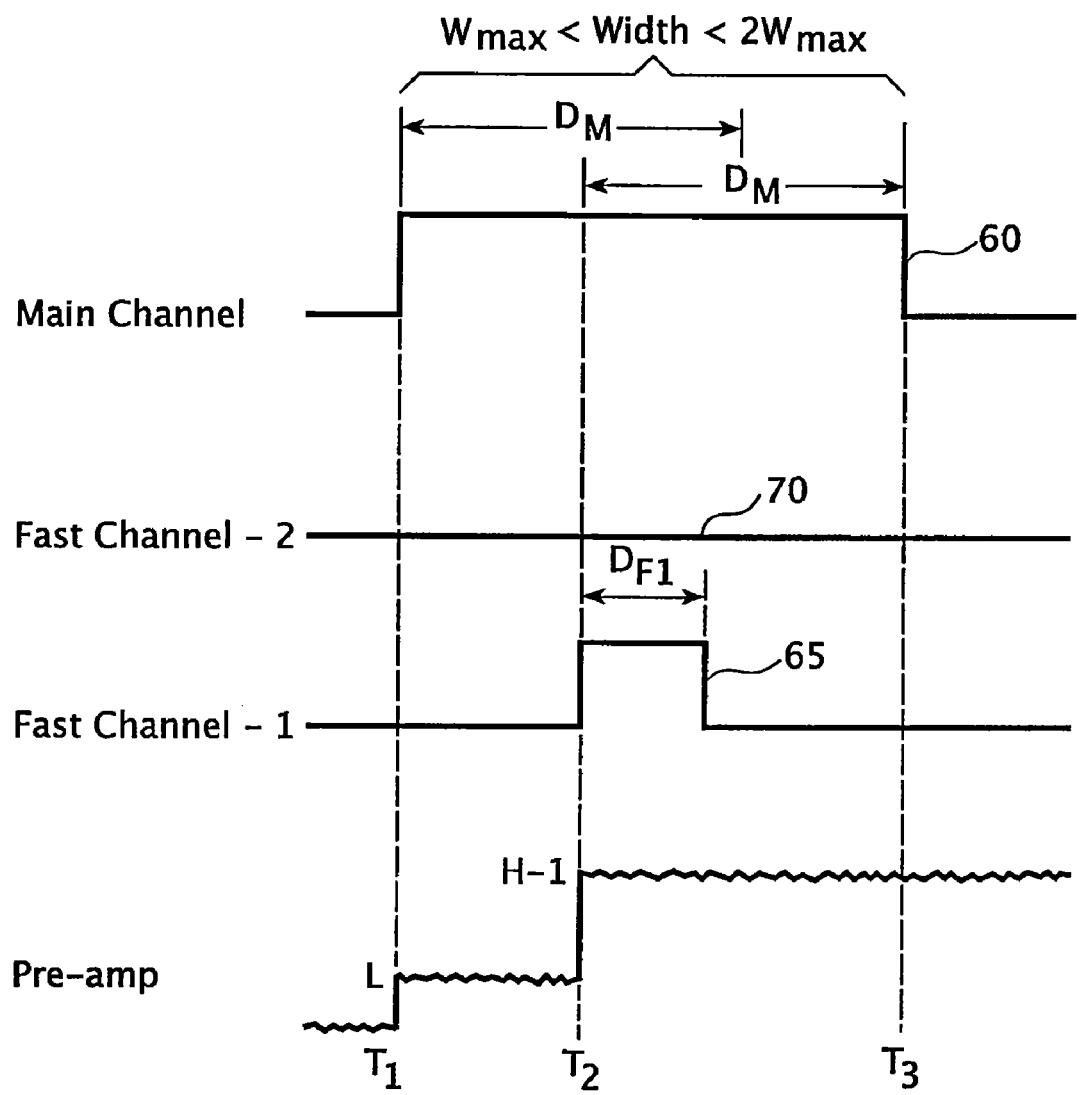
FIG. 7 is a schematic illustration of the situation where a two X-ray pile-up consists of a low energy X-ray followed by a high energy X-ray and shows the states of the main channel dead time signal, the first fast channel dead time signal and the second fast channel dead time signal in response thereto.

FIG. 7 illustrates the situation where a two X-ray pile-up consists of a low energy X-ray followed by a high energy X-ray. In particular, as seen in FIG. 7, a low energy X-ray L arrives at time $T_1$ and a high energy X-ray H-1 (having an energy that is above the detection threshold of the first fast channel 45 but below the detection threshold of the second fast channel 50) arrives at time $T_2$. As noted above, the existence of the two X-ray pile-up may be detected from the main channel dead time signal 60, and in particular from the fact that it includes a pulse having a width that is greater than $W_{max}$ but less than $2W_{max}$. As seen in FIG. 7, the low energy X-ray L will cause the main channel dead time signal 60 to be triggered (go high) at time $T_1$, but neither the first fast channel 45 or the second fast channel 50 will be trigged at that time. The high energy X-ray H-1 will cause the first (but not the second) fast channel dead time signal 65 to be triggered (go high) at time $T_2$. The main channel dead time 60 will remain high until time $T_3$ (i.e., until the processing of the high energy X-ray H-1 is completed). Thus, once it is determined from the main channel dead time signal 60 that a two X-ray pile-up has occurred as described elsewhere herein, logic can be used to discern from the main channel dead time signal 60, the first fast channel dead time signal 65 and the second fast channel dead time signal 70 the energy level of each pile-up X-ray and the time at which each pile-up X-ray arrived. In particular, referring to FIG. 7, because only the main channel 40 and neither the first fast channel 45 nor the second fast channel 50 was triggered at time $T_1$, it can be discerned that the first X-ray in the pile-up was a low energy X-ray L (having an energy above the detection threshold of the main channel 40 but below the detection thresholds of the first fast channel 45 and the second fast channel 50) arrived at time $T_1$ (the time of the main channel 40 trigger). In addition, because the first (but not the second) fast channel 45 was triggered at time $T_2$ while the main channel dead time 60 remained high, it can be discerned that the second X-ray in the pile-up sequence was a high energy X-ray H-1 (having an energy between the detection thresholds of the first fast channel 45 and the second fast channel 50) and that that X-ray arrived at $T_2$ (the time when the first fast channel 45 was triggered without the second fast channel 50 also being triggered).

Figure 8:
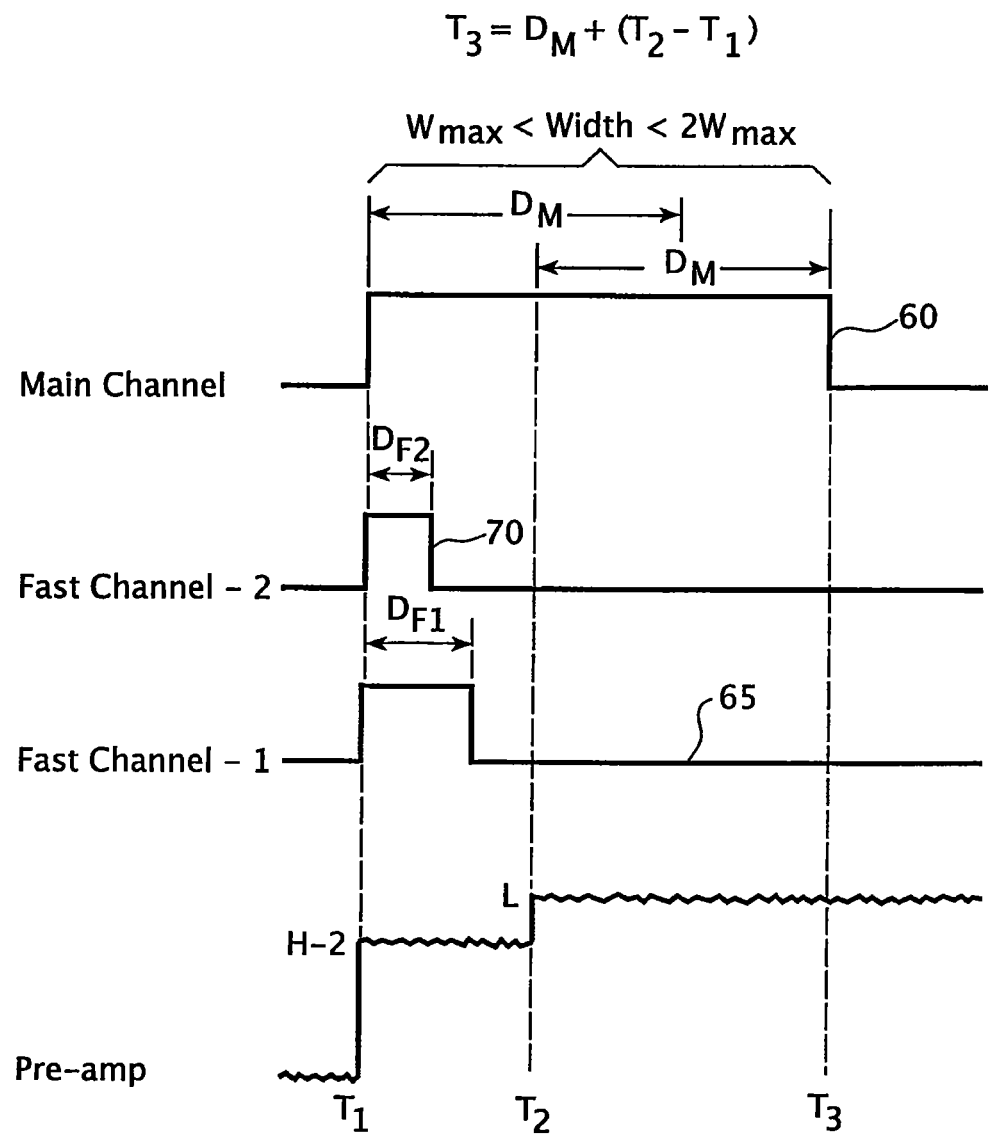
FIG. 8 is a schematic illustration of the situation where a two X-ray pile-up consists of a high energy X-ray followed by a low energy X-rays and shows the states of the main channel dead time signal, the first fast channel dead time signal and the second fast channel dead time signal in response thereto.

FIG. 8 illustrates the situation where a two X-ray pile-up consists of a high energy X-ray followed by a low energy X-ray. In particular, as seen in FIG. 8, a first high energy X-ray H-2 (above the detection threshold of the second fast channel 50) arrives at time $T_1$ and a low energy X-ray L (above the detection threshold of the main channel 40 but below the detection thresholds of both the first fast channel 45 and the second fast channel 50) arrives at time $T_2$. As noted above, the existence of the two X-ray pile-up may be inferred from the main channel dead time signal 60, and in particular from the fact that it includes a pulse having a width that is greater than $W_{max}$ but less than $2W_{max}$. As seen in FIG. 8, the first high energy X-ray H-2 will cause both the second fast channel dead time signal 70 and the first fast channel dead time signal 65 to be triggered (go high) at time $T_1$. In addition, the low energy X-ray will not cause either the first fast channel 45 or the second fast channel 50 to be triggered (and thus the corresponding signals will be low), but will cause the main channel dead time signal 60 to continue to remain high (beginning at time $T_2$) while the low energy X-ray is being processed. The main channel dead time signal 60 will thus be initially triggered at time $T_1$ and will remain high until time $T_3$ (i.e., until the processing of the low energy X-ray L is completed). Thus, once it is determined from the main channel dead time signal 60 that a two X-ray pile-up has occurred as described above, logic can be used to discern from the main channel dead time signal 60, the first fast channel dead time signal 65 and a second fast channel dead time signal 60 the energy of each pile-up X-ray and the time at which each pile-up X-ray arrived. In particular, referring to FIG. 8, because both the main channel 40 and the second fast channel 50 were triggered at time $T_1$, it can be discerned that the first X-ray in the pile-up was a high energy X-ray H-2 (having an energy above the detection threshold of the second fast channel 50) and that that X-ray arrived at time $T_1$ (the time of the second fast channel 50 trigger). In addition, because neither the first fast channel 45 nor the second fast channel 50 was subsequently triggered while the main channel dead time signal 60 was high, it can be discerned that the second X-ray in the pile-up was a low energy X-ray L (having an energy above the detection threshold of the main channel 40 but below the detection thresholds of the first fast channel 45 and the second fast channel 50). In addition, because $T_3=D_M+(T_2-T_1)$, the arrival time $T_2$ of the low energy X-ray L can be determined from the following formula: $T_2=(T_1+T_3)-D_M$, wherein $T_1$ may be determined from the time at which the second fast channel 50 was initially triggered and $T_3$ may be determined from the time at which the main channel dead time signal 60 goes low.

Figure 9:
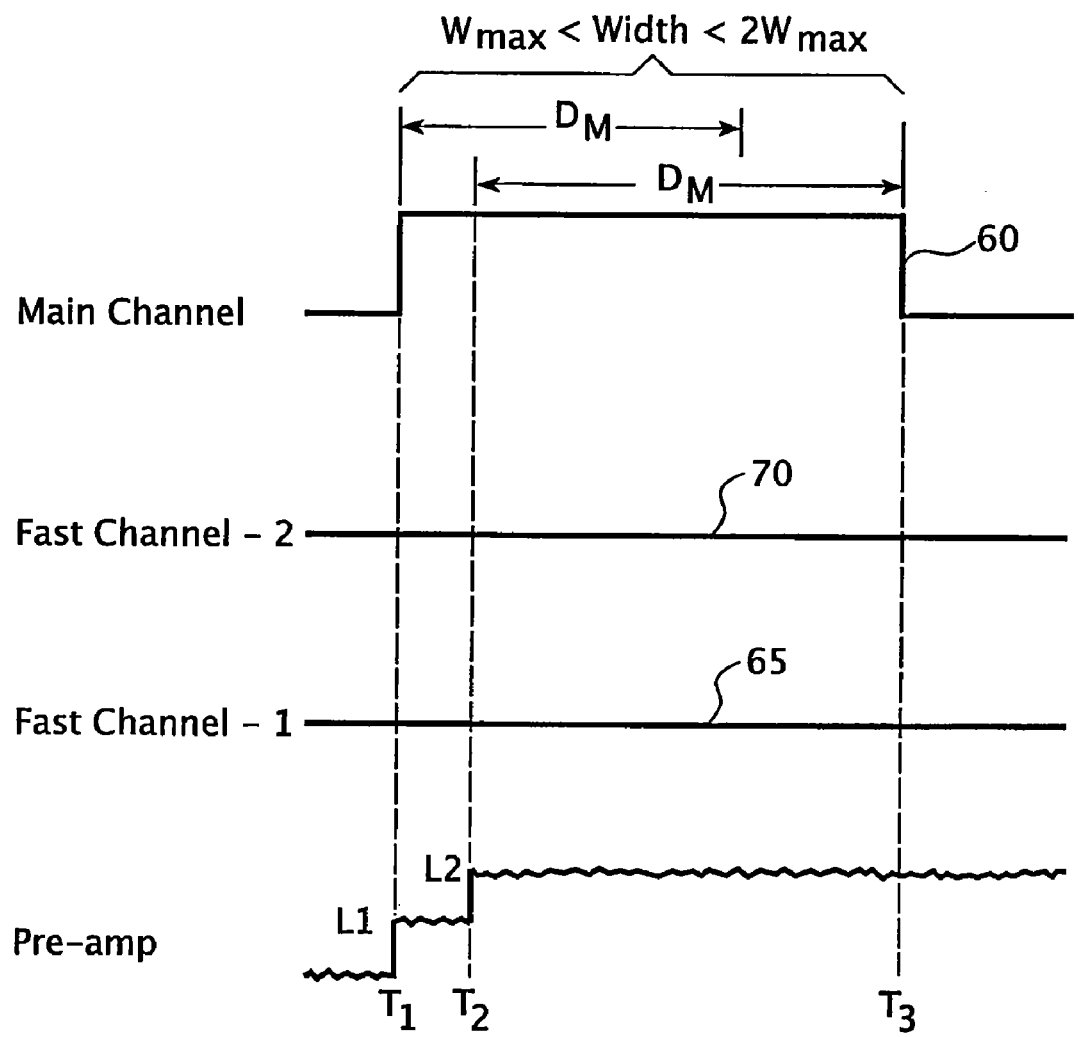
FIG. 9 is a schematic illustration of the situation where a two X-ray pile-up consists of two low energy X-rays in sequence and shows the states of the main channel dead time signal, the first fast channel dead time signal and the second fast channel dead time signal in response thereto.

FIG. 9 illustrates the situation where a two X-ray pile-up consists of two low energy X-rays in sequence. In particular, as seen in FIG. 9, a first low energy X-ray L arrives at time $T_1$ and a second low energy X-ray L arrives at time $T_2$ (each of the low energy X-rays has an energy that is above the detection threshold of the main channel 40 but below the detection threshold of each of the first fast channel 45 and a second fast channel 50). As noted above, the existence of the two X-ray pile-up may be inferred from the main channel dead time signal 60, and in particular from the fact that it includes a pulse having a width that is greater than $W_{max}$ but less than $2W_{max}$. As seen in FIG. 9, the first low energy X-ray L will cause the main channel dead time signal 60 to be triggered (go high) at time $T_1$ and the second low energy X-ray L will cause the main channel dead time signal 60 to remain high for as long as the second low energy X-ray L is being processed. In addition, neither the first fast channel 45 nor the second fast channel 50 will be triggered upon arrival of either of the low energy X-rays L. In addition, the main channel dead time signal 60 will remain high until time $T_3$ (i.e., until the processing of the second low energy X-ray is completed). Thus, once it is determined from the main channel dead time signal 60 that a two X-ray pile-up has occurred as described above, logic can be used to discern from the main channel dead time signal 60, the first fast channel dead time signal 65 and the second fast channel dead time signal 70 the energy level of each pile-up X-ray and the time at which each pile-up X-ray arrived. In particular, referring to FIG. 9, because the main channel 40 was triggered at time $T_1$ and neither the first fast channel 45 nor the second fast channel 50 was trigged at time $T_1$, it can be discerned that the first X-ray in the pile-up was a low energy X-ray L and that that X-ray arrived at time $T_1$ (the time that the main channel 40 was triggered). In addition, because neither the first fast channel 45 nor the second fast channel 50 was triggered while the main channel dead time signal 60 remained high, it can be discerned that the second X-ray in the pile-up was also a low energy X-ray L. Because $T_3=D_M+(T_2-T_1)$, the arrival time of the second low energy X-ray L may be determined from the following formula: $T_2=(T_1-T_3)-D_M$, wherein, $T_1$ is the time at which the main channel 40 was triggered and $T_3$ is the time at which the main channel dead time signal 60 goes low following time $T_1$. Note, this same formula may also be used to determine the arrival time of the second X-ray in the cases where the sequence of X-rays in the pile-up is two high energy X-rays in sequence (FIG. 6) or a low energy X-ray followed by a high energy X-ray (FIG. 7).

A second embodiment of the invention will now be described with reference to FIG. 10. This embodiment provides a method for detecting a pile-up consisting of an arbitrary sequence of low energy and high energy X-rays in, for example, the main channel 40 of the pulse processor 35 shown in FIG. 4, although it should be appreciated that this is meant to be exemplary only in that other X-ray spectrometry configurations (with more or less fast channels) may also be used. The method shown in FIG. 10 enables the detection (i.e., the recognition that it has occurred) of all high energy X-rays that may occur in a pile-up sequence of three or more X-rays, the detection of a leading low energy X-ray in such a sequence, if present, the detection of a final (trailing) low energy X-ray in such a sequence, if present, and the detection of all intermediately occurring low energy X-rays in such a sequence except for low energy X-rays that immediately follow a high energy X-ray and that immediately precede a final (trialing) low energy X-ray in such a sequence where the spacing between the occurrence of such a high energy X-ray and a final (trailing) low energy X-ray is less than $W_{max}$. In other words, if an intermediate low energy X-ray occurs that follows a high energy X-ray in the sequence and precedes a final (trailing) low energy X-ray in the sequence, the occurrence of that intermediate low energy X-ray will only be able to be detected by the method shown in FIG. 10 if the interval between the high energy X-ray and the final (trailing) low energy X-ray is greater than $W_{max}$. Furthermore, the method shown in FIG. 10 enables the arrival time of all high energy X-rays, any leading low energy X-rays, if present, and any final (trailing) low energy X-rays in a sequence of three or more pile-up X-rays to be measured. Certain other intermediate low energy X-rays, while able to be detected, are not able to be timed by the method shown in FIG. 10.

Figure 10:
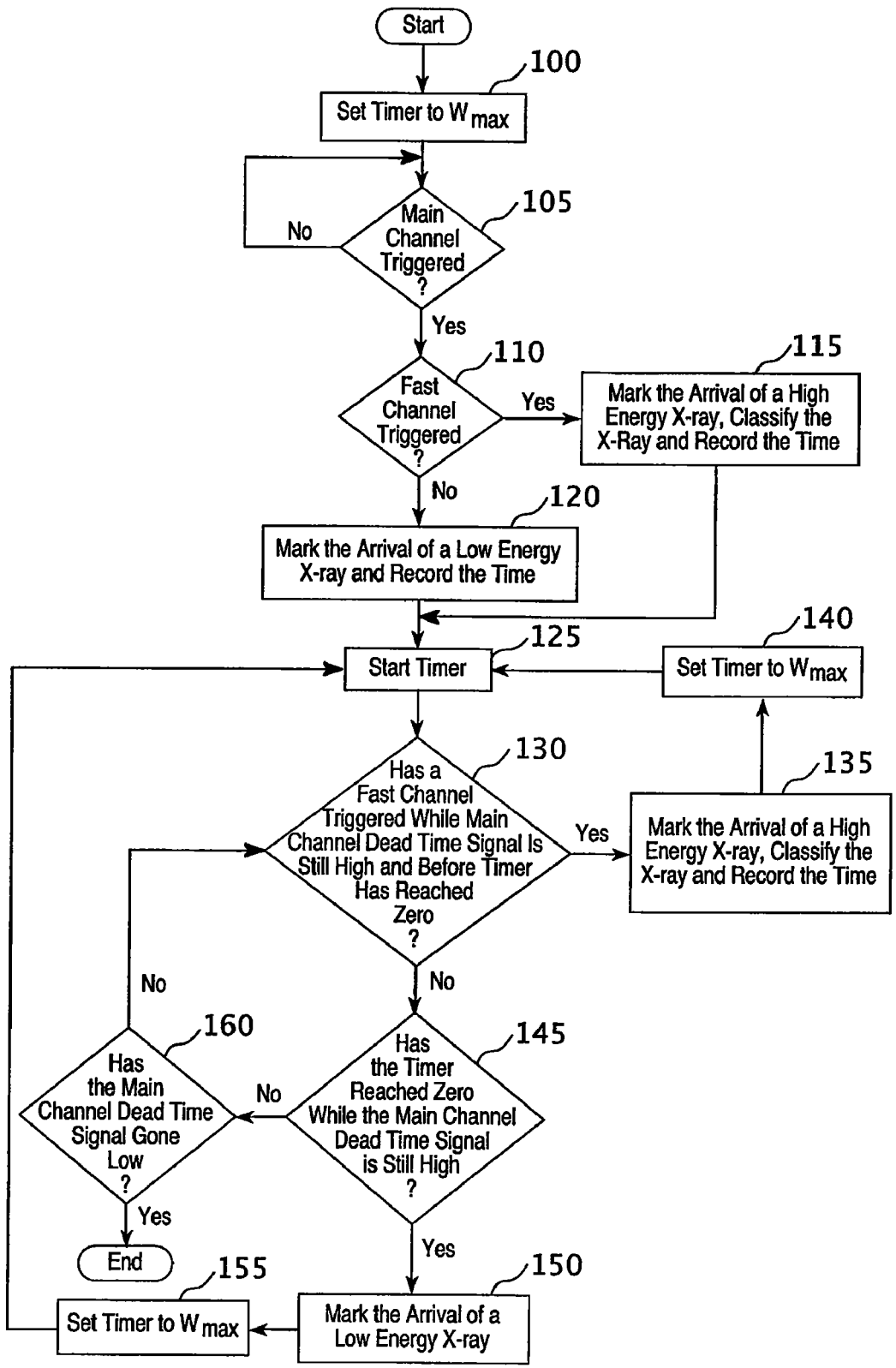
FIG. 10 is a method for detecting an X-ray pile-up consisting of an arbitrary sequence of low energy and high energy X-rays according to one particular embodiment of the invention.

Referring to FIG. 10, the method begins at step 100, wherein a countdown timer is initialized to a value equal to $W_{max}$. Next, at step 105, a determination is made as to whether the main channel 40 has been triggered, as evidenced by a rising edge on the main channel dead time pulse 60. If the answer at step 105 is no, then the method waits for the main channel 40 to be triggered. If, however, the answer at step 105 is yes, then at step 110, a determination is made as to whether one of the fast channels (i.e., the first fast channel 45 or the second fast channel 50) has been triggered. If the answer at step 110 is yes, then that means that the first X-ray in the pile-up sequence is a high energy X-ray (either a high energy X-ray H-1 or a high energy X-ray H-2 as described elsewhere herein). Thus, in such a case, the method proceeds to step 115, wherein the occurrence/arrival of a high energy X-ray is marked, the energy level of the X-ray is classified based upon the particular fast channel or channels that have been triggered, and the time of arrival for the X-ray is recorded. As will be appreciated, the time of arrival of this high energy X-ray will be the time associated with the triggering of the fast channel(s) and the main channel 40. If, however, the answer at step 110 is no, meaning that the first X-ray in the pile-up sequence is a low energy X-ray, then, at step 120, the occurrence/arrival of a low energy X-ray is marked and the arrival time of the low energy X-ray is recorded. As will be appreciated, the arrival time of this low energy X-ray (which is a leading low energy X-ray) will correspond to the time at which the main channel 40 was triggered. Following either step 115 or step 120, whichever is appropriate, the method proceeds to step 125, wherein the countdown timer is started. Following step 125, the method proceeds to step 130, wherein a determination is made as to whether one of the fast channels (45 or 50) has been triggered while the main channel dead time signal 60 is still high and before the countdown timer has reached zero. If the answer at step 130 is yes, then, at step 135, the occurrence/arrival of a high energy X-ray is marked, the X-ray is classified according to energy level based upon the particular fast channel or channels that have been triggered, and the arrival time for the high energy X-ray is recorded (based upon the time at which the fast channel or channels were triggered). Next, at step 140, the countdown timer is reset to $W_{max}$ and the method returns to step 125. If, however, the answer at step 130 is no, then, at step 145, a determination is made as to whether the countdown timer has reached zero while the main channel dead time signal 60 is still high. If the answer at step 145 is yes, then that means that a low energy X-ray has occurred in the pile-up sequence. In such a case, the method proceeds to step 150, wherein the occurrence/arrival of a low energy X-ray is marked. Next, at step 155, the countdown timer is reset to $W_{max}$, and the method returns to step 125. If, however, the answer at step 145 is no, then, at step 160, a determination is made as to whether the main channel dead time signal 60 has gone low. If the answer is no, then the method returns to step 130 for further processing. If, however, the answer at step 160 is yes, then that means that the pile-up sequence is complete and the method ends as there are no more pile-up X-rays to detect. Following the completion of the method of FIG. 10, if the final detected X-ray in the sequence is a low energy X-ray, then the arrival time of that final (trailing) low energy X-ray may be determined by determining the time at which the main channel dead time signal 60 went low and subtracting from that a value equal to the main channel dead time $D_M$. As will be appreciated, no such subtraction is necessary in the case of a final (trailing) high energy X-ray as the arrival time of that X-ray will be indicated by the time of the associated fast channel trigger (see step 135). Thus, the method shown in FIG. 10 provides for the detection of a pile-up consisting of an arbitrary sequence of low energy and high energy X-rays wherein all high energy pile-up X-rays may be detected and accurately timed, wherein all leading and trailing low energy X-rays in the sequence may be detected and accurately timed, and wherein certain intermediate low energy X-rays may be detected, although not timed.

Thus, the invention provides processing methods that derive useful information about pile up X-rays from the main and fast channel outputs. For instance, information may be derived about the number of pile-up X-rays, the energies of the pile-up X-rays (e.g., classifying them as above or below one or more fast channel thresholds) and/or the time intervals between the pile-up X-rays. In a simple implementation, pile-up X-rays may be counted and classified as low energy (below any fast channel detection threshold) or high energy (above any fast channel detection threshold). This simple implementation provides useful information which may be used to aid in discriminating (relatively rapidly) between elemental compositions, particularly if the triggering energy of a fast channel, which may be usefully set at any energy at or above its minimum detection threshold (so that the fast channel has a set detection threshold higher than its minimum), is set such that it lies between two X-ray emission peaks which vary strongly between two compositions. For example, in a rapid survey of mineral particles, it may be of interest to distinguish between sulfides and silicates. The sulfur emission peak is at 2.3 keV, while the silicon emission peak is at 1.74 keV and the oxygen emission peak is at 0.52 keV. If the trigger energy of a single fast channel is set at 2 keV, the ratio of X-rays above and below that energy would be quite different for sulfides vs. silicates or oxides of otherwise similar metals. Therefore a particle could be assigned to one class or the other with a given probably based on fewer total X-rays acquired if the high-low energy distribution (e.g., a ratio or percentage) of piled-up X-rays is used along with the energies of measurable (non-pile-up) X-rays. In more sophisticated implementations, the arrival times of certain X-rays in a pile-up sequence (and time intervals between certain pile-up X-rays) may be obtained and used. For instance, in the case of a scanning system where the excitation point from which the X-rays are emitted may be changing rapidly, the arrival times of pile-up X-rays may be translated into positional offsets to, for example, infer the emission location (from a material) of the pile-up X-rays (the arrival at the detector is effectively simultaneous with the emission form the specimen). For instance, in a scanning electron microscope (SEM), the pixel dwell time of the electron beam may be short compared to the interval between arriving X-rays. If the emission location of each X-ray detected in a pile-up sequence can be measured as described herein, each X-ray can be placed at the correct pixel in the resulting image. Previously, low energy X-rays in a pile-up sequence could not be mapped correctly under fast scan conditions in any prior art system.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed is:

1. A method of processing signals relating to a plurality of X-rays received in an X-ray spectrometry system, said X-ray spectrometry system including a pulse processor having a main channel and one or more fast channels, the method comprising:

receiving a main channel dead time signal generated by said pulse processor, said main channel dead time signal being in a first main channel active state when at least one X-ray is being processed by said main channel;

receiving one or more fast channel dead time signals, each of said one or more fast channel dead time signals being generated by said pulse processor and being in a respective first fast channel active state when at least one X-ray is being processed by a corresponding respective one of said one or more fast channels;

detecting an occurrence of a plurality of piled-up X-rays in an X-ray pile-up sequence using one or more of said main channel dead time signal and said one or more fast channel dead time signals, wherein a first one of said piled-up X-rays causes said main channel dead time signal to be in said first main channel active state and wherein each of said piled-up X-rays other than said first one of said piled-up X-rays arrives while said main channel dead time signal is in said first main channel active state; and classifying an energy level of each of said piled-up X-rays using one or more of said main channel dead time signal and said one or more fast channel dead time signals.

2. The method according to claim 1, further comprising determining an arrival time for one or more of said piled-up X-rays using one or more of said main channel dead time signal and said one or more fast channel dead time signals.

3. The method according to claim 1, further comprising determining, for one or more pairs of said piled-up X-rays, a time interval between the arrival of each of the piled-up X-rays in the pair using one or more of said main channel dead time signal and said one or more fast channel dead time signals.

4. The method according to claim 1, wherein said main channel has a main channel detection threshold and wherein each of said one or more fast channels has a corresponding respective fast channel detection threshold, wherein said classifying step comprises classifying an energy level of each of said piled-up X-rays by segregating each of said piled-up X-rays into either a first low energy group or a second high energy group, wherein each of said piled-up X-rays segregated into said first low energy group has an energy level above said main channel detection threshold and below the fast channel detection threshold of each of said one or more fast channels and wherein each of said piled-up X-rays segregated into said second high energy group has an energy level above the fast channel detection threshold of at least one of said one or more fast channels.

5. The method according to claim 4, wherein said one or more fast channels are single fast channel, and wherein each of said piled-up X-rays segregated into said second high energy group has an energy level above the fast channel detection threshold of said single fast channel.

6. The method according to claim 1, wherein said one or more fast channels are a plurality of fast channels, wherein said main channel has a main channel detection threshold and wherein each of said plurality of fast channels has a corresponding respective fast channel detection threshold, wherein said classifying step comprises classifying an energy level of each of said piled-up X-rays as belonging to one of a plurality of energy bands, said energy bands including a first energy band between said main channel detection threshold and a lowest one of the fast channel detection thresholds, a plurality of second energy bands, each of said second energy bands being between respective consecutive ones of the fast channel detection thresholds, and a third energy band above a highest one of the fast channel detection thresholds.

7. The method according to claim 1, wherein said detecting step comprises detecting the occurrence of the plurality of piled-up X-rays in the X-ray pile-up sequence using each of said main channel dead time signal and said one or more fast channel dead time signals and said classifying step comprises classifying the energy level of each of said piled-up X-rays using each of said main channel dead time signal and said one or more fast channel dead time signals.

8. The method according to claim 2, wherein the step of determining an arrival time uses each of said main channel dead time signal and said one or more fast channel dead time signals.

9. The method according to claim 3, wherein the step of determining, for one or more pairs of said piled-up X-rays, the time interval uses each of said main channel dead time signal and said one or more fast channel dead time signals.

10. The method according to claim 1, further comprising using a result of said classifying step to aid in discriminating between at least two elemental compositions.

11. The method according to claim 10, wherein said step of using a result of said classifying step to aid in discriminating between at least two elemental compositions comprises generating a high-low energy distribution of said piled-up X-rays using said energy level of each of said piled-up X-rays and using said high-low energy distribution to aid in discriminating between at least two elemental compositions.

12. The method according to claim 4, further comprising using said first low energy group and said second high energy group to aid in discriminating between at least two elemental compositions.

13. The method according to claim 12, wherein said step of using said first low energy group and said second high energy group to aid in discriminating between at least two elemental compositions comprises generating a high-low energy distribution of said piled-up X-rays using said first low energy group and said second high energy group and using said high-low energy distribution to aid in discriminating between at least two elemental compositions.

14. The method according to claim 2, further comprising using, for one or more of said one or more of said piled-up X-rays, the arrival time thereof to infer an emission location thereof from a material.

15. The method according to claim 14, further comprising using said emission location of each of said one or more of said one or more of said piled-up X-rays to place said each of said one or more of said one or more of said piled-up X-rays at a correct pixel location in an image of said material.

16. The method according to claim 1, wherein $W_{max}$ represents a widest, in terms of time, pulse in the main channel dead time signal that is expected to result from a single X-ray being processed in the main channel, wherein said plurality of piled-up X-rays in said X-ray pile-up sequence comprises two piled-up X-rays, wherein said method further comprising monitoring said main channel dead time signal and determining whether said main channel dead time signal has a width greater than $W_{max}$ but less than $2W_{max}$, and wherein said detecting and classifying steps are performed only if it is determined that said main channel dead time signal has a width greater than $W_{max}$ but less than $2W_{max}$.

17. The method according to claim 1, further comprising using at least the energy level of one or more of said piled-up X-rays to analyze one or more materials.

18. The method according to claim 2, further comprising using at least the energy level and arrival time of one or more of said piled-up X-rays to analyze one or more materials.

19. The method according to claim 3, further comprising using at least the energy level of one or more of said piled-up X-rays and at least one said time interval to analyze one or more materials.

20. A method of processing signals relating to a plurality of X-rays received in an X-ray spectrometry system, said X-ray spectrometry system including a pulse processor having a main channel and one or more fast channels, the method comprising:
receiving a main channel dead time signal generated by said pulse processor, said main channel dead time signal being in a first main channel active state when at least one X-ray is being processed by said main channel;
receiving one or more fast channel dead time signals, each of said one or more fast channel dead time signals being generated by said pulse processor and being in a respective first fast channel active state when at least one X-ray is being processed by a corresponding respective one of said one or more fast channels;
setting a countdown timer to a value $W_{max}$, wherein $W_{max}$ represents a widest, in terms of time, pulse in the main channel dead time signal that is expected to result from a single X-ray being processed in the main channel;
starting said countdown timer and noting an occurrence of a first one of a plurality of piled-up X-rays in an X-ray pile-up sequence when said main channel dead time signal moves to said first main channel active state;
classifying an energy level of said first one of said plurality of piled-up X-rays using one or more of said main channel dead time signal and said one or more fast channel dead time signals;
noting an occurrence of a subsequent high energy one of said plurality of piled-up X-rays and resetting said countdown timer to $W_{max}$ each time one or more of said one or more fast channel dead time signals moves to the first fast channel active state thereof while said dead time signal is still in said first main channel active state as a result of said starting step; and
noting an occurrence of a subsequent low energy one of said plurality of piled-up X-rays and resetting said countdown timer to $W_{max}$ each time said countdown timer reaches zero while said dead time signal is still in said first main channel active state as a result of said starting step.

21. The method according to claim 20, further comprising classifying an energy level of each said subsequent high energy one of said plurality of piled-up X-rays using said one or more fast channel dead time signals.

22. The method according to claim 20, further comprising determining an arrival time of said first one of said plurality of piled-up X-rays using one or more of said main channel dead time signal and said one or more fast channel dead time signals and an arrival time of each said subsequent high energy one of said plurality of piled-up X-rays using said one or more fast channel dead time signals.

23. The method according to claim 22, further comprising determining an arrival time of one or more of the subsequent low energy ones of said plurality of piled-up X-rays using one or more of said main channel dead time signal and said one or more fast channel dead time signals.

24. The method according to claim 21, wherein said main channel has a main channel detection threshold and wherein each of said one or more fast channels has a corresponding respective fast channel detection threshold, wherein said step of noting an occurrence of a subsequent low energy one of said plurality of piled-up X-rays includes classifying an energy level of the subsequent low energy one of said plurality of piled-up X-rays, the method further comprising segregating the energy level of each of said plurality of piled-up X-rays into either a first low energy group or a second high energy group, wherein each of said piled-up X-rays segregated into said first low energy group has an energy level above said main channel detection threshold and below the fast channel detection threshold of each of said one or more fast channels and wherein each of said piled-up X-rays segregated into said second high energy group has an energy level above the fast channel detection threshold of at least one of said one or more fast channels.

25. The method according to claim 24, wherein said one or more fast channels are single fast channel, and wherein each of said piled-up X-rays segregated into said second high energy group has an energy level above the fast channel detection threshold of said single fast channel.

26. The method according to claim 21, wherein said one or more fast channels are a plurality of fast channels, wherein said main channel has a main channel detection threshold and wherein each of said plurality of fast channels has a corresponding respective fast channel detection threshold, wherein said step of noting an occurrence of a subsequent low energy one of said plurality of piled-up X-rays includes classifying an energy level of the subsequent low energy one of said plurality of piled-up X-rays, the method further comprising segregating the energy level of each of said piled-up X-rays as belonging to one of a plurality of energy bands, said energy bands including a first energy band between said main channel detection threshold and a lowest one of the fast channel detection thresholds, a plurality of second energy bands, each of said second energy bands being between respective consecutive ones of the fast channel detection thresholds, and a third energy band above a highest one of the fast channel detection thresholds.

27. The method according to claim 21, wherein said step of noting an occurrence of a subsequent low energy one of said plurality of piled-up X-rays includes classifying an energy level of the subsequent low energy one of said plurality of piled-up X-rays, the method further comprising using the energy level of each of said piled-up X-rays to aid in discriminating between at least two elemental compositions.

28. The method according to claim 27, wherein said step of using the energy level of each of said piled-up X-rays to aid in discriminating between at least two elemental compositions comprises generating a high-low energy distribution of said piled-up X-rays using said energy level of each of said piled-up X-rays and using said high-low energy distribution to aid in discriminating between at least two elemental compositions.

29. The method according to claim 24, further comprising using said first low energy group and said second high energy group to aid in discriminating between at least two elemental compositions.

30. The method according to claim 29, wherein said step of using said first low energy group and said second high energy group to aid in discriminating between at least two elemental compositions comprises generating a high-low energy distribution of said piled-up X-rays using said first low energy group and said second high energy group and using said high-low energy distribution to aid in discriminating between at least two elemental compositions.

31. The method according to claim 23, further comprising using, for one or more of said piled-up X-rays, the arrival time thereof to infer an emission location thereof from a material.

32. The method according to claim 31, further comprising using said emission location of each of said one or more of said piled-up X-rays to place said each of said one or more of said piled-up X-rays at a correct pixel location in an image of said material.

33. The method according to claim 21, wherein said step of noting an occurrence of a subsequent low energy one of said plurality of piled-up X-rays includes classifying an energy level of the subsequent low energy one of said plurality of piled-up X-rays, the method further comprising using at least the energy level of one or more of said piled-up X-rays to analyze one or more materials.

34. The method according to claim 23, wherein said step of noting an occurrence of a subsequent low energy one of said plurality of piled-up X-rays includes classifying an energy level of the subsequent low energy one of said plurality of piled-up X-rays, the method further comprising using at least the energy level and arrival time of one or more of said piled-up X-rays to analyze one or more materials.

35. A method of processing signals relating to a plurality of X-rays received in an X-ray spectrometry system, said X-ray spectrometry system including a pulse processor having a main channel, the method comprising:

receiving a main channel dead time signal generated by said pulse processor, said main channel dead time signal being in a first main channel active state when at least one X-ray is being processed by said main channel;

setting a countdown timer to a value $W_{max}$, wherein $W_{max}$ represents a widest, in terms of time, pulse in the main channel dead time signal that is expected to result from a single X-ray being processed in the main channel;

starting said countdown timer and noting an occurrence of a first one of a plurality of piled-up X-rays in an X-ray pile-up sequence when said main channel dead time signal moves to said first main channel active state;

noting an occurrence of a subsequent one of said plurality of piled-up X-rays and resetting said countdown timer to $W_{max}$ each time said countdown timer reaches zero while said dead time signal is still in said first main channel active state as a result of said starting step.

36. The method according to claim 35, further comprising determining an arrival time of said first one of said plurality of piled-up X-rays using said main channel dead time signal.

37. The method according to claim 36, further comprising determining an arrival time of one or more of the subsequent ones of said plurality of piled-up X-rays using said main channel dead time signal.

38. The method according to claim 37, further comprising using, for one or more of said piled-up X-rays, the arrival time thereof to infer an emission location thereof from a material.

39. The method according to claim 38, further comprising using said emission location of each of said one or more of said piled-up X-rays to place said each of said one or more of said piled-up X-rays at a correct pixel location in an image of said material.

* * * * *